United States Patent
Tanaka et al.

(10) Patent No.: US 6,700,790 B2
(45) Date of Patent: Mar. 2, 2004

(54) CIRCUIT BOARD WITH INTEGRATED CIRCUIT

(75) Inventors: Tomoji Tanaka, Toyokawa (JP); Yutaka Yamamoto, Shinshiro (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 10/391,795

(22) Filed: Mar. 20, 2003

(65) Prior Publication Data

US 2003/0184980 A1 Oct. 2, 2003

(30) Foreign Application Priority Data

Mar. 27, 2002 (JP) ........................................ 2002-088164

(51) Int. Cl.[7] .............................. H05K 1/00; H05K 1/18; H05K 7/02; H05K 7/06; H05K 7/08
(52) U.S. Cl. ...................... 361/748; 361/760; 361/761; 361/763; 361/764; 361/777; 361/780; 361/791; 361/794; 361/782; 361/774
(58) Field of Search ................................. 361/760, 761, 361/763, 764, 777, 748, 780, 791, 794, 782, 774

(56) References Cited

U.S. PATENT DOCUMENTS

| | | | | |
|---|---|---|---|---|
| 5,068,631 A | | 11/1991 | Vince | |
| 5,283,717 A | * | 2/1994 | Hundt | 361/813 |
| 6,040,985 A | * | 3/2000 | Arai et al. | 361/780 |
| 6,215,372 B1 | * | 4/2001 | Novak | 333/12 |
| 6,297,965 B1 | * | 10/2001 | Sasaki et al. | 361/782 |
| 6,480,396 B2 | * | 11/2002 | Ninomiya | 361/780 |
| 6,483,714 B1 | * | 11/2002 | Kabumoto et al. | 361/760 |
| 6,573,600 B2 | * | 6/2003 | Kikuchi et al. | 257/750 |

* cited by examiner

*Primary Examiner*—Randy Gibson
*Assistant Examiner*—Thanh Y. Tran
(74) *Attorney, Agent, or Firm*—Morrison & Foerster LLP

(57) ABSTRACT

In a circuit board comprising multiple layers and having an integrated circuit mounted on the outer layer thereof, a main power supply plane and a sub-power supply plane, which is disposed in an island fashion with a clearance that terminates electric connection with the main power supply plane, are formed on the same layer. The main power supply plane and the sub-power supply plane are connected by first power supply patterns that are formed on a layer different from the layer on which the power supply planes are formed and to which bypass condensers are connected. Power supply to some power supply terminals is achieved via second power supply patterns that are connected to the sub-power supply plane. The leakage of noise from the power supply terminals connected to the second power supply patterns is controlled by the first power supply patterns. Through this construction, the EMI noise radiated from the circuit board can be reduced while minimizing the number of bypass condensers.

14 Claims, 5 Drawing Sheets

CIRCUIT BOARD WITH INTEGRATED CIRCUIT

The present application claims priority to Japanese Patent Application No. 2002-88164 filed Mar. 27, 2002, the entire content of which is hereby incorporated by reference.

BACKGROUND OF THE INVENTION

1. Field of the Invention

The present invention relates to a circuit board on which an integrated circuit having multiple power supply terminals is mounted.

2. Description of the Related Art

As the operating frequencies of circuit boards on which integrated circuits (ICs) are mounted have increased in recent years, reduction in electromagnetic radiation noise (EMI noise) has become a particular issue. In one conventional method to reduce EMI noise, a device, e.g. bypass condensers are connected between the integrated circuit's power supply terminals and power supply plane and near the power supply terminals to bypass high-frequency power supply noise to the ground.

When reducing noise using bypass condensers, a bypass condenser is ideally located near each power supply terminal in the case of a circuit board on which is mounted an application-specific IC (ASIC) such as an integrated circuit that has multiple power supply terminals.

However, given that the arrangement of power supply terminals in an ASIC or the like is generally random, and is determined without consideration of the allocation of bypass condensers on the board, an increase in the number of bypass condensers leads to an increase in the component cost, etc., with the result that it is impractical to connect a bypass condenser to every power supply terminal. On the other hand, if there is a power supply terminal to which no bypass condenser is connected, common mode noise caused due to the high-speed switching operation of the ASIC or the like leaks to the power supply plane, thereby increasing the amount of EMI noise radiated from the circuit board.

SUMMARY OF THE INVENTION

A main object of the present invention is to provide a circuit board that can reduce noise while limiting the number of bypass condensers.

In order to attain this and other objects, according to one aspect of the present invention, the circuit board includes an outer layer on which an integrated circuit having multiple power supply terminals is mounted; a first power supply plane that is formed on a layer that is different from the outer layer, and receives power supply externally; a second power supply plane that is formed on the same layer as the first power supply plane but has a gap that terminates the electric connection with the first power supply plane; first power supply patterns that are formed on the outer layer and are electrically connected to the first power supply plane and the second power supply plane; bypass condensers that are disposed between the first power supply patterns and the ground; and second power supply patterns that are electrically connected to the second power supply plane and the power supply terminals.

Using the construction described above, at least some of the power supply terminals included in the integrated circuit are connected to the second power supply patterns. Consequently, bypass condensers need not be individually assigned to these power supply terminals, enabling the number of bypass condensers to be limited. In addition, because the leakage of noise from the power supply terminals to the first power supply plane can be reduced by the bypass condensers, noise reduction can be achieved as well.

It is preferred that the ground be disposed on a ground layer that is separate from the layer on which the first power supply plane and the second power supply plane are disposed, as well as from the outer layer on which the first power supply patterns and the second power supply patterns are disposed, such that the ground layer faces the second power supply plane. This is preferred because forming a capacitance between the ground layer and the second power supply plane permits a noise reduction effect to be obtained.

It is further preferred that the ground layer be disposed between the layer on which the first power supply plane and the second power supply plane are disposed and the outer layer. This is preferred because a further radiation noise reduction effect can be obtained based on the shielding effect of the ground layer.

In addition, it is preferred that the second power supply plane be disposed at a location that corresponds to the bottom of the integrated circuit and that the abovementioned gap be disposed along the outer circumference of the integrated circuit. This is the empirically preferred actual configuration of the second power supply plane.

Moreover, multiple multi-layer condensers having different capacitances may be mounted on the outer layer as the bypass condensers, and the condensers may be connected in a parallel fashion between the first power supply patterns and the ground such that the condensers closer to the first power supply plane have a higher capacitance.

When disposed such that the effect of the pattern inductor component from the integrated circuit to the bypass condenser is minimized, low-capacitance bypass condensers can reduce the deterioration in their high-frequency characteristics and offer an attenuation effect at a higher frequency.

The invention itself, together with further objects and attendant advantages, will best be understood by reference to the following detailed description taken in conjunction with the accompanying drawings.

BRIEF DESCRIPTION OF THE DRAWINGS

In the following description, like parts are designated by like reference numbers throughout the several drawings.

DETAILED DESCRIPTION OF THE PREFERRED EMBODIMENTS

An embodiment of the circuit board pertaining to the present invention is described below with reference to the drawings.

Figure 1:
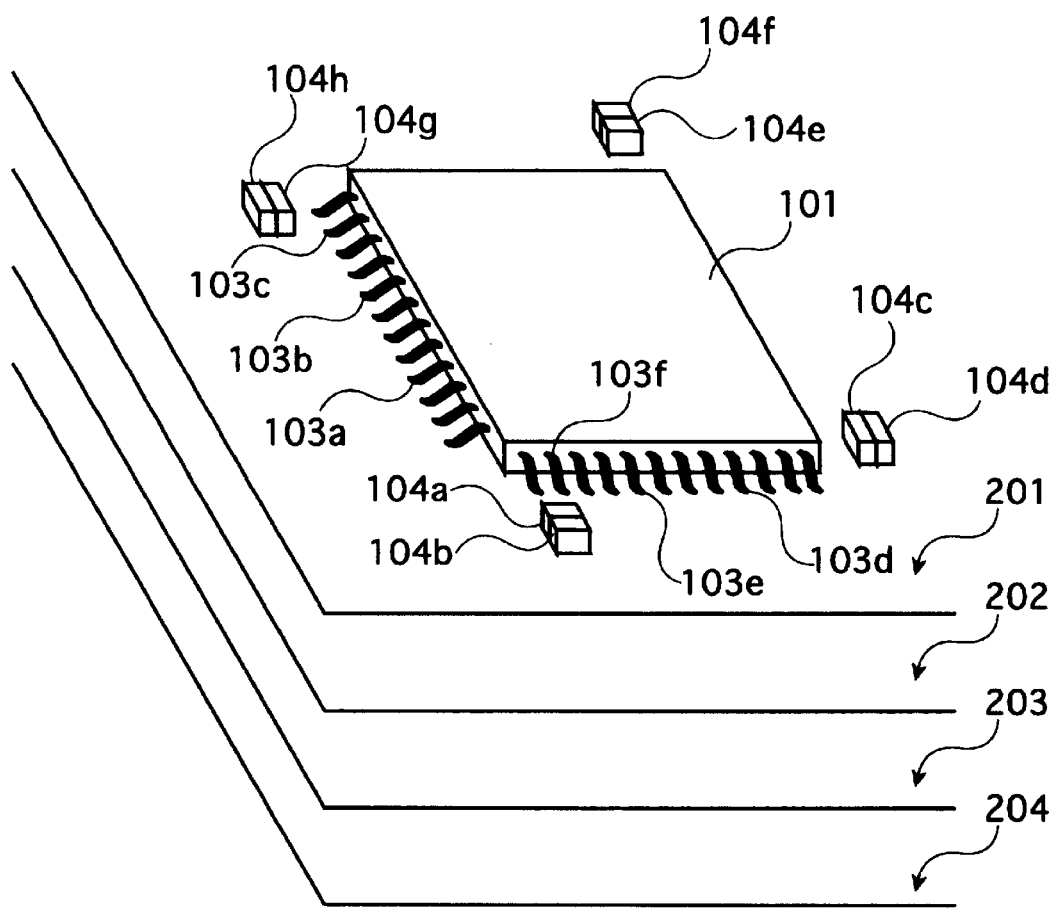
FIG. 1 is a perspective view showing the basic construction of a circuit board pertaining to an embodiment of the present invention.

FIG. 1 is a perspective view showing the basic construction of the circuit board of an embodiment of the present invention. The circuit board of this embodiment comprises a four-layer board including four layers 201–204 that are formed with insulating members between each layer. An ASIC 101 including multiple power supply terminals (of which terminals 103*a*–103*f* are shown) is mounted on the outer layer 201, and power supply patterns by which to supply power to the ASIC 101 and signal patterns are also formed thereon.

Bypass condensers 104*a*–104*h* for noise reduction are also mounted on the outer layer 201. Where all of the bypass condensers 104*a*–104*h* are referred to below, they will be collectively termed 'bypass condensers 104'. In this embodiment, multi-layer ceramic condensers are used as the bypass condensers 104. The capacitance of each bypass condenser is explained below.

The second layer 202 below the outer layer 201 comprises a ground layer. In this embodiment, the entire surface of the layer comprises a ground solid other than the areas where via holes are formed. Power supply planes for external power supply are formed on the third layer 203. The power supply plane is shared by multiple devices mounted to the circuit board. The external power supply voltage is generally 3.3V, and an internal logic power supply (2.5V) for the ASIC 101 can be generated using a three-terminal regulator, for example.

Figure 2:
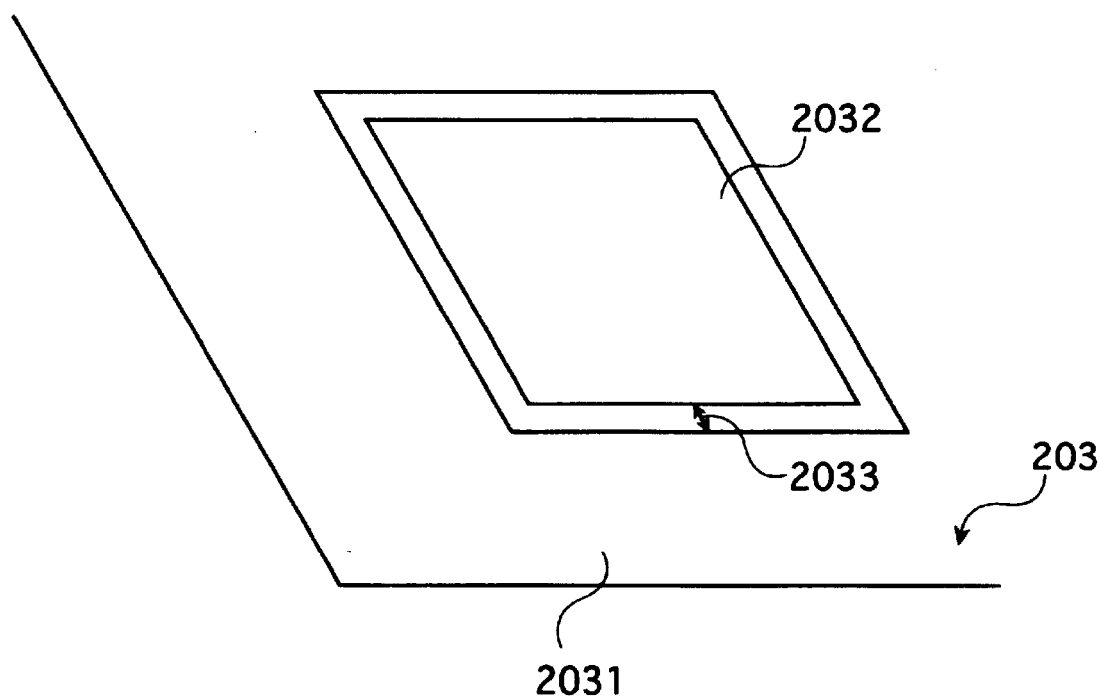
FIG. 2 is a perspective view showing the third layer 203.

FIG. 2 is a perspective view showing the third layer 203. In this embodiment, a main power supply plane 2031 and a sub-power supply plane 2032 that is formed as an island with a gap (hereinafter referred to as 'clearance') 2033 that terminates electric connection between the main power supply plane 2031 and the sub-power supply plane 2032 are formed on this layer. In this embodiment, it is assumed that the above 2.5V power supply is supplied to the main power supply plane 2031. While the clearance 2033 has a 2 mm width here, the clearance 2033 is not limited to this width. Considering the induction current and the like created by the electric binding of the sub-power supply plane 2032 and the main power supply plane 2031, it is preferred that such width fall within the range of 0.5 mm to 3 mm. Power supply patterns and signal patterns similar to those on the outer layer 201 are formed on the fourth layer 204.

Figure 3:
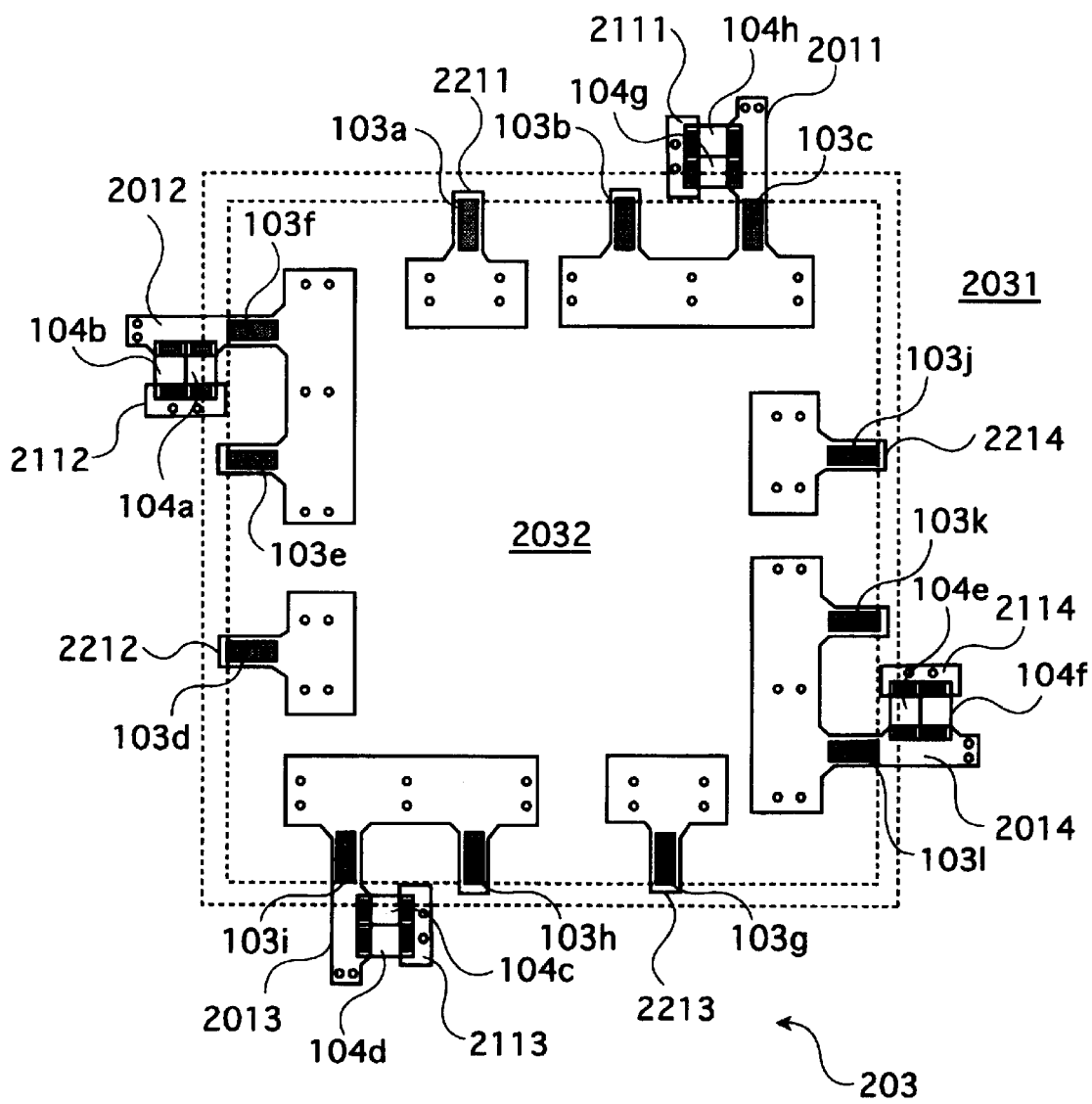
FIG. 3 is a drawing by which to explain the power supply patterns formed on the outer layer 201.
Figure 4:
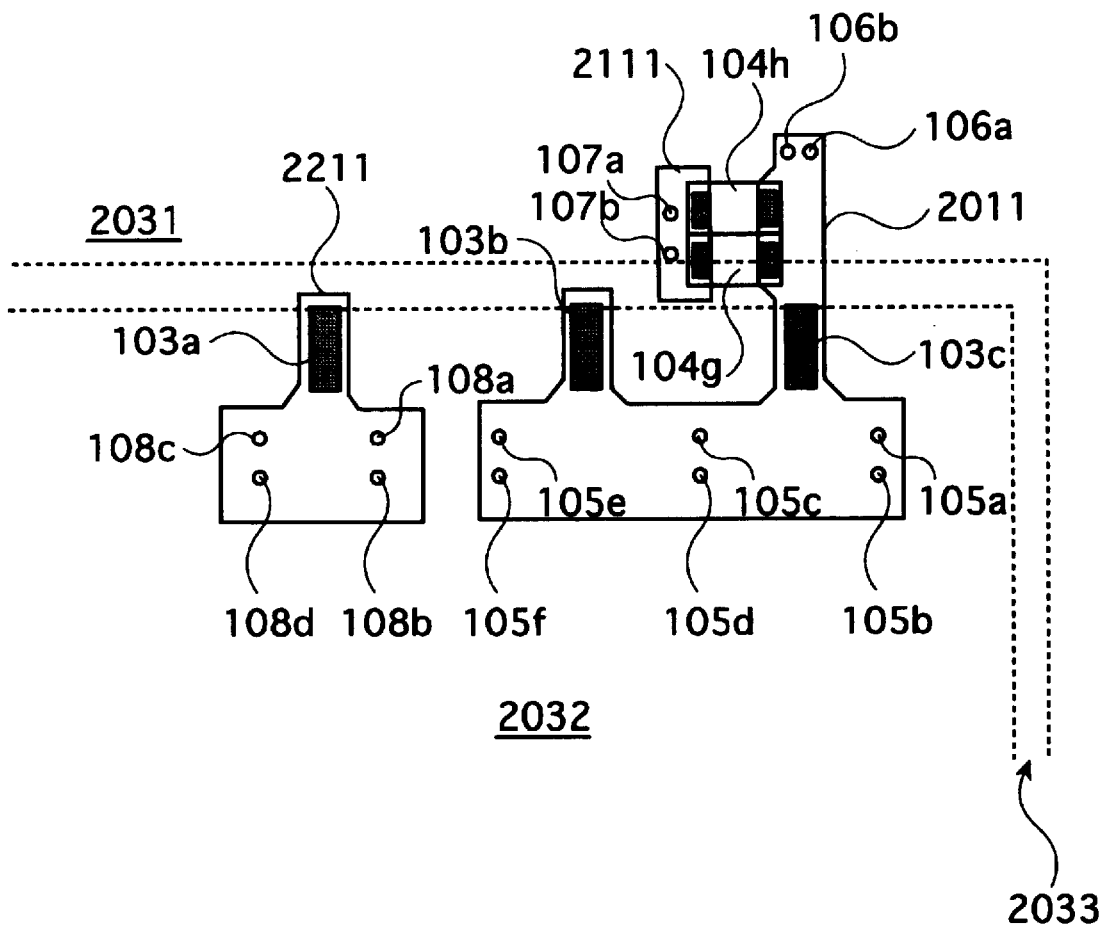
FIG. 4 is a partial expanded view of FIG. 3.

The power supply patterns formed on the outer layer 201 will now be described in detail. FIG. 3 is a drawing by which to explain the power supply patterns formed on the outer layer 201. FIG. 4 is a partial expanded view of FIG. 3.

As shown in FIG. 3, first power supply patterns (power supply patterns on which bypass condensers are disposed) 2011–2014, bypass condenser connection patterns 2111–2114, and second power supply patterns (power supply patterns on which no bypass condensers are directly disposed) 2211–2214 are formed on the outer layer 201 for one ASIC 101 that includes a total of 12 power supply terminals, such that each pattern of the three types is distributed at four different locations. The dotted lines in the drawing indicate the clearance 2033 formed on the third layer 203, such that the area outside the clearance 2033 is the main power supply plane 2031 and the area inside the inner dotted line is the sub-power supply plane 2032.

As shown in more detail in FIG. 4, the first power supply pattern 2011 that is electrically connected to the power supply terminals 103*b* and 103*c* of the ASIC 101 are electrically connected to the main power supply plane 2031 through via holes 106*a* and 106*b*, as well as to the sub-power supply plane 2032 through via holes 105*a*–105*f*. The sub-power supply plane 2032 is electrically insulated from the main power supply plane 2031 by the clearance 2033 on the third layer 203. However, the sub-power supply plane 2032 is electrically connected to the main power supply plane 2031 via the first power supply pattern 2011 formed on the outer layer 201.

Bypass condensers 104*g* and 104*h* are disposed between the first power supply pattern 2011 and the bypass condenser connection pattern 2111 that is connected to the second layer (the ground layer) 202 through via holes 107*a* and 107*b*. Based on the operation of these bypass condensers 104*g* and 104*h*, the leakage of common mode noise to the main power supply plane 2031 caused by the high-speed switching operation, etc. of the ASIC 101 becomes controlled, contributing to a reduction in the amount of EMI noise radiated from the circuit board.

As shown in FIGS. 3 and 4, the sub-power supply plane 2032 of this embodiment is disposed at a location corresponding to the bottom of the ASIC 101, and the clearance 2033 is disposed along the outer circumference of the rectangular ASIC 101. These positions are determined empirically as the preferred positions partly because of the noise reduction effect that is obtained due to the capacitance formed between the sub-power supply plane 2032 and the ground layer 202 that faces the sub-power supply plane 2032. In this embodiment, noise reduction is also achieved based on the shielding effect of the ground layer 202 disposed between the third layer 203 on which the main power supply plane 2031 and the sub-power supply plane 2032 are formed and the outer layer 201.

Power supply to the power supply terminal 103*a* is carried out without direct disposition of a bypass condenser and via the second power supply pattern 2211 that is electrically connected to the sub-power supply plane 2032 through via holes 108*a*–108*d*. Although the second power supply pattern 2211 is not directly connected to the main power supply plane 2031, because the sub-power supply plane 2032 is connected to the first power supply pattern 2011, the leakage of noise to the main power supply plane 2031 is controlled based on the operation of the bypass condensers 104*g* and 104*h* connected to the first power supply pattern 2011.

Figure 5:
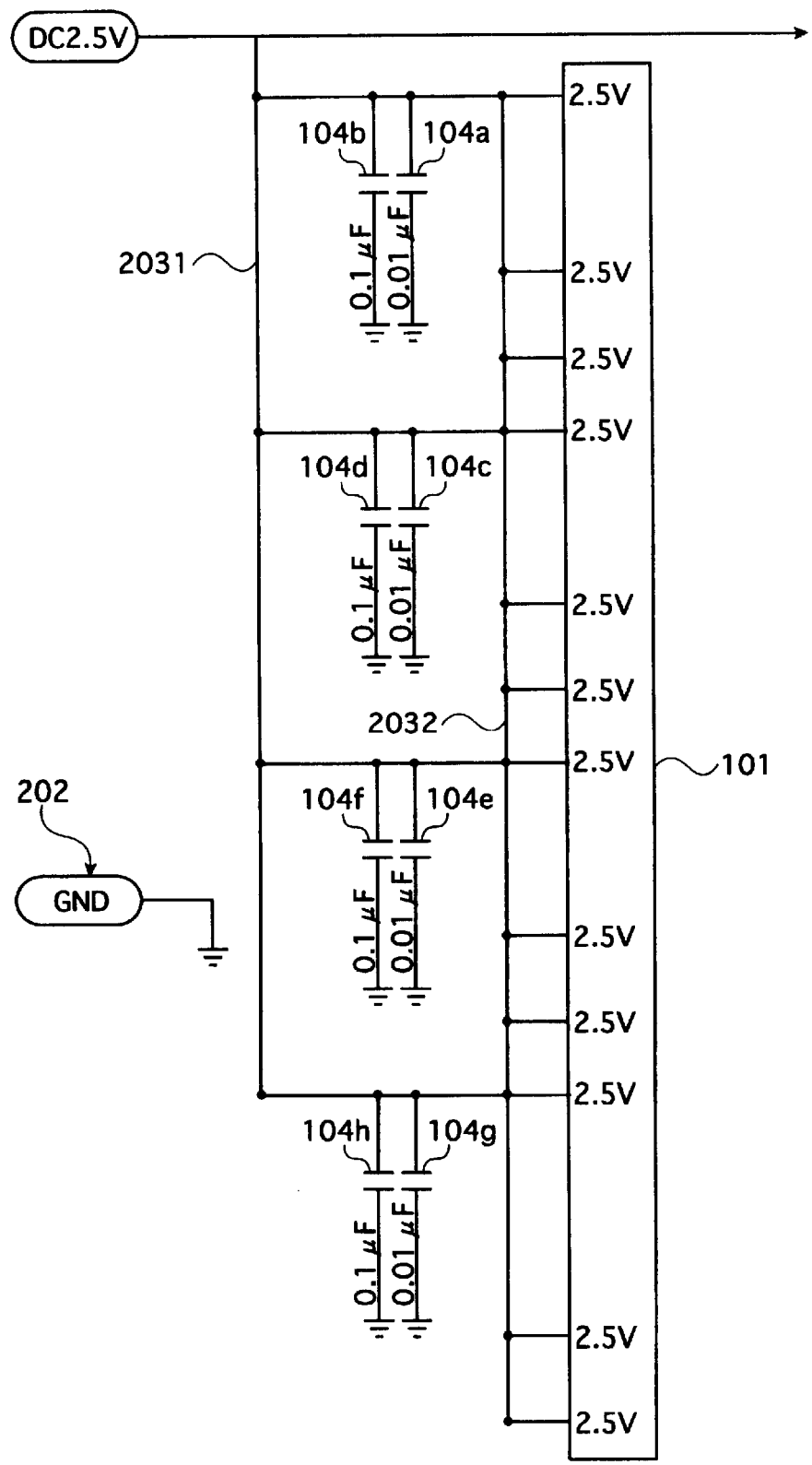
FIG. 5 is a drawing by which to explain the capacitance of the bypass condensers 104.

The capacitance of the bypass condensers 104 will now be explained. FIG. 5 is a drawing by which to explain the capacitance of the bypass condensers 104. As shown in this drawing, the capacitance of the bypass condensers 104*a*, 104*c*, 104*e* and 104*g* is 0.01 $\mu$F, and the capacitance of the bypass condensers 104*b*, 104*d*, 104*f* and 104*h* is 0.1 $\mu$F, respectively. Bypass condensers having different capacitances are connected in a parallel fashion in this manner between the first power supply patterns 2011, etc. and the bypass condenser connection patterns 2111, etc. in this embodiment. When this arrangement is viewed in terms of the positional relationship to the main power supply plane 2031 and the sub-power supply plane 2032, in particular, the connection arrangement is such that the capacitance of each bypass condenser is inversely proportional to its distance to the main power supply plane 2031.

Using the circuit board of the present invention described above, even where an integrated circuit such as an ASIC that includes multiple power supply terminals is mounted, bypass condensers are not needed for each of the power supply terminals, and therefore, the number of bypass condensers can be reduced, and the leakage of common mode noise to the main power supply plane caused by the high-speed switching operation, etc. of the integrated circuit can be controlled, enabling EMI noise to be reduced as well.

Finally, the results of investigation of the specific effects of the present invention are briefly explained below. When comparison was made between a circuit board in which the present invention was applied and a control circuit board (that had the same number of inserted bypass condensers as the test circuit board but did not have a sub-power supply plane) using a near magnetic field probe circuit board scanning measurement device (model ESV-3000 manufactured by Noise Laboratory Co., Ltd.), an approximately 15 dB improvement was obtained, making it clear that the present invention offers a significant reduction in common mode noise.

Modifications

The above description was provided in connection with the circuit board of the present invention based on an embodiment, but, the present invention is naturally not limited to the specific example shown in the embodiment. For example, the following modifications are also possible.

(1) In the above embodiment, power supply to the power supply terminal 103a was effected via the second power supply pattern 2211 and power supply to the power supply terminals 103b and 103c was effected via the first power supply pattern 2011, for example (see FIG. 4). However, the method of achieving power supply to the power supply terminals on the integrated circuit is not limited to this implementation. The object of the present invention can be attained if power is supplied to at least some (or all) of the power supply terminals using second power supply patterns on which no bypass condensers are disposed.

In other words, it is acceptable if the first power supply patterns on which bypass condensers are disposed are used for the purpose of power supply from the main power supply plane 2031 to the sub-power supply plane 2032, and direct power supply to the power supply terminals is exclusively achieved from the sub-power supply plane.

(2) In the above embodiment, the second layer 202 comprised a ground layer, wherein essentially the entire surface thereof was a ground solid. While it is preferred that a ground layer be formed between the layer on which the main power supply plane 2031 and the sub-power supply plane 2032 are formed (the third layer 203) and the outer layer 201 due to the noise reduction offered by the shielding effect of the ground layer 202 in such a construction, as described above, the present invention is not limited to this implementation. In addition, it is acceptable if essentially the entire surface of the layer is not used for the ground layer 202. Naturally, however, where the ground layer is disposed such that it faces the sub-power supply plane 2032, a capacitance is formed between the ground layer and the sub-power supply plane 2032, as described above, which is preferred from the standpoint of noise reduction.

(3) In the above embodiment, a 3.3V power supply such as the ASIC's I/O power supply was not specifically referred to, but the present invention can naturally be applied in such a case as well. Although a larger effect can generally be obtained from the disposition of bypass condensers for the internal logic power supply (2.5V) described in detail above than for an I/O power supply due to the former component's higher power consumption, a larger noise reduction effect can be expected through the application of the present invention to both types of power supply.

(4) In the above embodiment, four first power supply patterns 2011–2014 to which bypass condensers 104 are connected are formed on an ASIC 101 packaged into a rectangular configuration such that the power supply patterns are essentially symmetrical relative to each other when seen from the center of the rectangle. While it is preferred to form the multiple first power supply patterns in this configuration for the purpose of noise reduction because the distances between the power supply terminals and the bypass condensers are reduced, the number of first power supply patterns can be only one or two instead. In addition, the locations at which first power supply patterns are disposed are not limited to the locations described above. The first power supply patterns may be disposed at the corners of the rectangle or in the centers of each side.

(5) In the above embodiment, a description was provided regarding an application of the present invention in a four-layer circuit board, but the present invention is not limited to this implementation. It can be applied in a two-sided circuit board (wherein one side comprises the outer layer, and power supply planes are disposed on the other side), or in a multi-layer circuit board having four or more layers.

According to the embodiment described above, because bypass condensers are disposed on the first power supply patterns that are electrically connected to the main power supply plane and the sub-power supply plane such that the bypass condensers reside between the first power supply patterns and the ground, and no bypass condensers are disposed on power supply terminals that are not connected to the first power supply patterns while such power supply terminals are connected to the second power supply patterns that are electrically connected to the sub-power supply plane, noise reduction can be achieved while limiting the number of bypass condensers.

Although the present invention has been fully described by way of examples with reference to the accompanying drawings, it is to be noted that various changes and modifications will be apparent to those skilled in the art. Therefore, unless such changes and modification depart from the scope of the present invention, they should be construed as being included therein.

What is claimed is:

1. A circuit board comprising:
   an outer layer on which an integrated circuit is mounted;
   a first power supply plane that is formed on a layer that is different from said outer layer, and receives power supply externally;
   a second power supply plane that is formed on a layer that is different from said outer layer, and has a gap that terminates the electric connection with the first power supply plane;
   a first power supply pattern that is electrically connected to said first power supply plane and said second power supply plane;
   a device that is disposed between said first power supply pattern and a ground, and bypasses a power supply noise to the ground; and
   a second power supply pattern that is electrically connected to said second power supply plane and power supply terminals of the integrated circuit.

2. A circuit board according to claim 1, wherein said first power supply plane and said second power supply plane are formed on the same layer.

3. A circuit board according to claim 2, wherein the ground is disposed on a ground layer that is separate from the layer on which said first power supply plane and said second power supply plane are disposed, as well as from the layer on which said first power supply pattern and said second power supply pattern are disposed, such that the ground layer faces said second power supply plane.

4. A circuit board according to claim 3, wherein the ground layer is disposed between the layer on which said first power supply plane and said second power supply plane are disposed and said outer layer.

5. A circuit board according to claim 1, wherein said second power supply plane is disposed at a location that corresponds to the bottom of the integrated circuit, and the gap is disposed along the outer circumference of said integrated circuit.

6. A circuit board according to claim 1, wherein said device includes a plurality of multi-layer condensers which have different capacitances, and are mounted on said outer layer.

7. A circuit board according to claim 6, wherein said plurality of multi-layer condensers are connected in a parallel fashion between said first power supply pattern and the ground such that the condensers closer to said first power supply plane have a higher capacitance.

8. A circuit board according to claim 1, wherein a device for bypassing a power supply noise to the ground is not connected to said second power supply pattern.

9. A circuit board according to claim 1, wherein said integrated circuit includes a plurality of power supply terminals, some of the power supply terminals are connected to said first power supply pattern, and the others of the power supply terminals are connected to said second power supply pattern.

10. A circuit board comprising:
an outer layer on which an integrated circuit having a plurality of power supply terminals is mounted;
a first power supply plane that is formed on a layer that is different from said outer layer, and receives power supply externally;
a second power supply plane that is formed on the same layer as said first power supply plane but has a gap that terminates the electric connection with said first power supply plane;
a first power supply pattern that is formed on said outer layer and is electrically connected to said first power supply plane and said second power supply plane;
a bypass condenser that is disposed between said first power supply pattern and a ground; and
a second power supply pattern that is electrically connected to said second power supply plane and said power supply terminals.

11. A circuit board according to claim 10, wherein the ground is disposed on a ground layer that is separate from the layer on which said first power supply plane and said second power supply plane are disposed, as well as from said outer layer on which said first power supply pattern and said second power supply pattern are disposed, such that the ground layer faces said second power supply plane.

12. A circuit board according to claim 11, wherein the ground layer is disposed between the layer on which said first power supply plane and said second power supply plane are disposed and said outer layer.

13. A circuit board according to claim 11, wherein said second power supply plane is disposed at a location that corresponds to the bottom of said integrated circuit and that the gap is disposed along the outer circumference of said integrated circuit.

14. A circuit board according to claim 10, wherein a plurality of multi-layer condensers having different capacitances are mounted on said outer layer as said bypass condenser, and the multi-layer condensers are connected in a parallel fashion between said first power supply pattern and the ground such that the multi-layer condensers closer to said first power supply plane have a higher capacitance.

* * * * *